United States Patent [19]
Beinglass et al.

[11] Patent Number: 5,940,733
[45] Date of Patent: Aug. 17, 1999

[54] METHOD OF MAKING POLYSILICON/ TUNGSTEN SILICIDE MULTILAYER COMPOSITE ON AN INTEGRATED CIRCUIT STRUCTURE

[75] Inventors: Israel Beinglass, Sunnyvale; Ramanujapuram A. Srinivas, San Jose, both of Calif.

[73] Assignee: Applied Materials, Inc., Santa Clara, Calif.

[21] Appl. No.: 08/901,879

[22] Filed: Jul. 29, 1997

Related U.S. Application Data

[63] Continuation of application No. 08/433,770, May 3, 1995, abandoned.

[51] Int. Cl.⁶ ................................. H01L 21/283
[52] U.S. Cl. ..................... 438/655; 438/657; 438/683; 438/908
[58] Field of Search ........................ 438/592, 655, 438/657, 683, 684, 907, 908, 913; 257/377, 384, 385, 755, 756

[56] References Cited

U.S. PATENT DOCUMENTS

| | | | |
|---|---|---|---|
| 4,584,760 | 4/1986 | Okazawa | 29/571 |
| 4,737,474 | 4/1988 | Price et al. | 437/200 |
| 4,966,869 | 10/1990 | Hillman et al. | 437/200 |
| 4,977,104 | 12/1990 | Swada et al. | 437/162 |
| 4,992,391 | 2/1991 | Wang | 437/43 |
| 5,130,266 | 7/1992 | Huang et al. | 437/44 |
| 5,141,892 | 8/1992 | Beinglass | 437/162 |
| 5,147,820 | 9/1992 | Chittipeddi et al. | 437/193 |
| 5,182,627 | 1/1993 | Chen et al. | 257/49 |
| 5,223,456 | 6/1993 | Malwah | 437/200 |
| 5,256,894 | 10/1993 | Shino | 257/388 |
| 5,332,692 | 7/1994 | Saitoh | 437/193 |

FOREIGN PATENT DOCUMENTS

| | | |
|---|---|---|
| 0529952A1 | 3/1993 | European Pat. Off. . |
| 62-115776 | 5/1987 | Japan . |
| 02066173 | 3/1990 | Japan . |

OTHER PUBLICATIONS

Hara, T., et al., "Tungsten Silicide Films . . . " J.Electrochem.Soc., vol. 136, No. 4, Apr. 1989, pp. 1177–1180.
Wolf, S., et al., Silicon Processing, vol. 1, Lattice Press, 1986, pp. 175–182.

(List continued on next page.)

*Primary Examiner*—T. N. Quach
*Attorney, Agent, or Firm*—Blakely Sokoloff Taylor & Zafman

[57] ABSTRACT

Described is an improved polysilicon/tungsten silicide ($WSi_x$) composite layer formed over an integrated circuit structure on a semiconductor wafer and characterized by improved step coverage and non tungsten-rich tungsten:silicon ratio of the $WSi_x$ layer, and a method of forming same. A doped layer of polysilicon is formed in a first deposition chamber over an integrated circuit structure previously formed on a semiconductor substrate and a capping layer of undoped polysilicon is then deposited in the first deposition chamber over the doped polysilicon layer. The substrate is then transferred from the first deposition chamber into a second deposition chamber without exposing the surface of the polysilicon layer to an oxidizing media. The desired tungsten silicide layer is then formed in the second deposition chamber onto undoped polysilicon capping layer, using a gaseous source of tungsten such as WF6, and dichlorosilane (DCS) as the source of silicon, without the formation of the undesirable tungsten-rich tungsten silicide layer characteristic of the prior art. The undoped polysilicon capping layer may then be doped, after the formation of the tungsten silicide layer, by subsequently heating the structure sufficiently to cause the dopant in the doped polysilicon layer to migrate into the undoped polysilicon layer thereon. Such heating may be carried out in a separate annealing step, but preferably is carried out in situ as a part of the subsequent processing of the integrated circuit structure being formed on the substrate.

14 Claims, 6 Drawing Sheets

OTHER PUBLICATIONS

Beinglass, I, et al., "Integrated System for Deposition of Polysilicon and WSix Films", Microelectronic Engineering, vol. 25, Aug. 1994, pp. 201–208.

"Method For Suppressing Diffusion of Dopant From Doped Polysilicon to Silicide", IBM Tech. Disc. Bull., vol. 32, No. 6A, Nov. 1989, pp. 206–207.

"Process for forming Tungsten Silicide with good adhesion to doped polycrystalline silicon", Research Disclosure, May 1988, p. 279.

Beinglass, Israel, "Integrating Polysilicon and Tungsten Silicide Deposition", *Electronics Engineer*, Mar., 1994, pp. 108–109 & 112–113.

METHOD OF MAKING POLYSILICON/ TUNGSTEN SILICIDE MULTILAYER COMPOSITE ON AN INTEGRATED CIRCUIT STRUCTURE

This is a continuation of application Ser. No. 08/433,770, filed May 3, 1995, now abandoned.

BACKGROUND OF THE INVENTION

1. Field of the Invention

This invention related to the field of integrated circuit structures. More particularly, this invention relates to an improved polysilicon/tungsten silicide multilayer composite formed on an integrated circuit structure, and a method of making same.

2. Description of the Related Art

The use of a layer of tungsten silicide over polysilicon is well known in the formation of integrated circuit structures. Conventionally, the respective polysilicon and tungsten silicide deposition steps were carried out in separate vacuum chambers with other intervening steps carried out outside of a vacuum environment. More recently, however, polysilicon and tungsten silicide depositions have been carried out in multiple vacuum chamber apparatus wherein the substrate is moved under vacuum from the polysilicon deposition chamber to the tungsten silicide deposition chamber. Such a procedure is described by Beinglass and Chang in "Integrating Polysilicon and Tungsten Silicide Deposition", published in Electronics Engineering in March 1994, at pages 108–109 and 112–113. This article describes the successful deposition of a polysilicon layer on a semiconductor substrate in one vacuum deposition chamber followed by transfer of the polysilicon-coated substrate through an intermediate transfer chamber to a second vacuum deposition chamber in the same apparatus for the deposition of tungsten silicide over the polysilicon layer without, however, exposing the coated substrate to ambient conditions in between the two depositions.

The deposition of the tungsten silicide ($WSi_x$) layer, in the process described in the above article, was carried out using $WF_6$ gas as the source of tungsten and silane ($SiH_4$) gas as the source of silicon. However, it has been found that for certain applications, such as improved step coverage and reduced fluorine content in the deposited tungsten silicide, the use of dichlorosilane (DCS) as the source of silicon is preferable to the use of silane in the formation of tungsten silicide. By use of the term "improved step coverage" is meant, that the portion of the tungsten silicide coating lying over a polysilicon layer in a via or contact opening will have a thickness which is over 50% of the thickness of the tungsten silicide layer lying over the remainder of the substrate when the aspect ratio of the via or contact opening is 2:1. That is, referring to FIG. 1, the thickness "X" of tungsten silicide layer 8 over polysilicon layer 7 in via 4 formed in, for example, insulator layer 6 over integrated circuit structure 2 is over 50% of the thickness "Y" of tungsten silicide layer 8 over polysilicon layer 7 on the surface of layer 6. By use of the term "reduced fluorine content" is meant a fluorine concentration of less than $10^{18}$ fluorine atoms/cm$^3$.

However, the use of DCS to form tungsten silicide in a multiple chamber vacuum system where the polysilicon-deposited surface is not subjected to a wash prior to deposition of the $WSi_x$ has given rise to a different problem, wherein the underlying doped polysilicon layer apparently acts as a nucleation layer for the deposition of a tungsten-rich tungsten silicide layer when DCS is the source of silicon. When an undoped layer of polysilicon is substituted for the doped layer, the problem does not occur. The term "tungsten-rich tungsten silicide" may be defined as a tungsten silicide layer wherein the tungsten to silicon ratio of the layer is not uniform, with the tungsten to silicon ratio in the tungsten silicide layer being higher adjacent the underlying silicon layer, which can, in turn, result in higher stress. Typically a "tungsten-rich tungsten silicide" will have a tungsten to silicon ratio of >1:2.1 at the tungsten silicide/polysilicon interface, i.e., more than 1 tungsten atom per 2.1 silicon atoms, where the normal tungsten: silicon ratio used, having the formula $WSi_x$, is such that x ranges from about 2.1 to about 2.9 throughout the tungsten silicide layer.

While a layer of undoped polysilicon could be formed over the integrated circuit structure on the substrate, instead of a doped layer, with the undoped polysilicon layer subsequently doped by an implantation step, after the deposition of the tungsten silicide layer, such an implantation step is sometimes not compatible with other portions of the integrated circuit substrate, nor is it economical, even if technically feasible.

It would, therefore, be desirable, to provide a structure and method wherein tungsten silicide may be formed over polysilicon, using DCS as a source of silicon, while avoiding the prior art problems which resulted from the use of DCS in such depositions, and without the need for a subsequent implantation step to dope the underlying polysilicon layer.

SUMMARY OF THE INVENTION

The invention comprises an improved polysilicon/tungsten silicide ($WSi_x$) composite layer formed over an integrated circuit structure on a semiconductor wafer and characterized by improved step coverage and non tungsten-rich tungsten:silicon ration of the ($WSi_x$) layer, and method of making same. In accordance with the invention, a doped layer of polysilicon is formed in a first deposition chamber over an integrated circuit structure previously formed on a semiconductor substrate and a capping layer of undoped polysilicon is then deposited in the first deposition chamber over the doped polysilicon layer. The substrate is then transferred from the first deposition chamber into a second deposition chamber without exposing the surface of the polysilicon layer to an oxidizing media. The desired tungsten silicide layer is then formed in the second deposition chamber over the undoped polysilicon capping layer, using a gaseous source of tungsten such as $WF_6$, and dichlorosilane as the source of silicon, without the formation of the undesirable tungsten-rich tungsten silicide layer characteristic of the prior art. The undoped polysilicon capping layer may then be doped, after the formation of the tungsten silicide layer, by annealing the structure to cause the dopant in the underlying doped polysilicon layer to migrate into the undoped polysilicon layer thereon. The anneal may be carried out in a separate annealing step. But preferably is carried out in situ as a part of the subsequent processing of the integrated circuit structure being formed on the substrate, e.g., during flow or reflow steps carried out during subsequent glass planarization of the structure.

DETAILED DESCRIPTION OF THE INVENTION

The invention comprises an improved composite of a doped layer of polysilicon formed over an integrated circuit structure on a semiconductor substrate and, overlying the doped polysilicon layer, a tungsten silicide layer formed using DCS as a source of silicon to provide better step coverage by the tungsten silicide layer, and a method of forming this structure.

Figure 1:
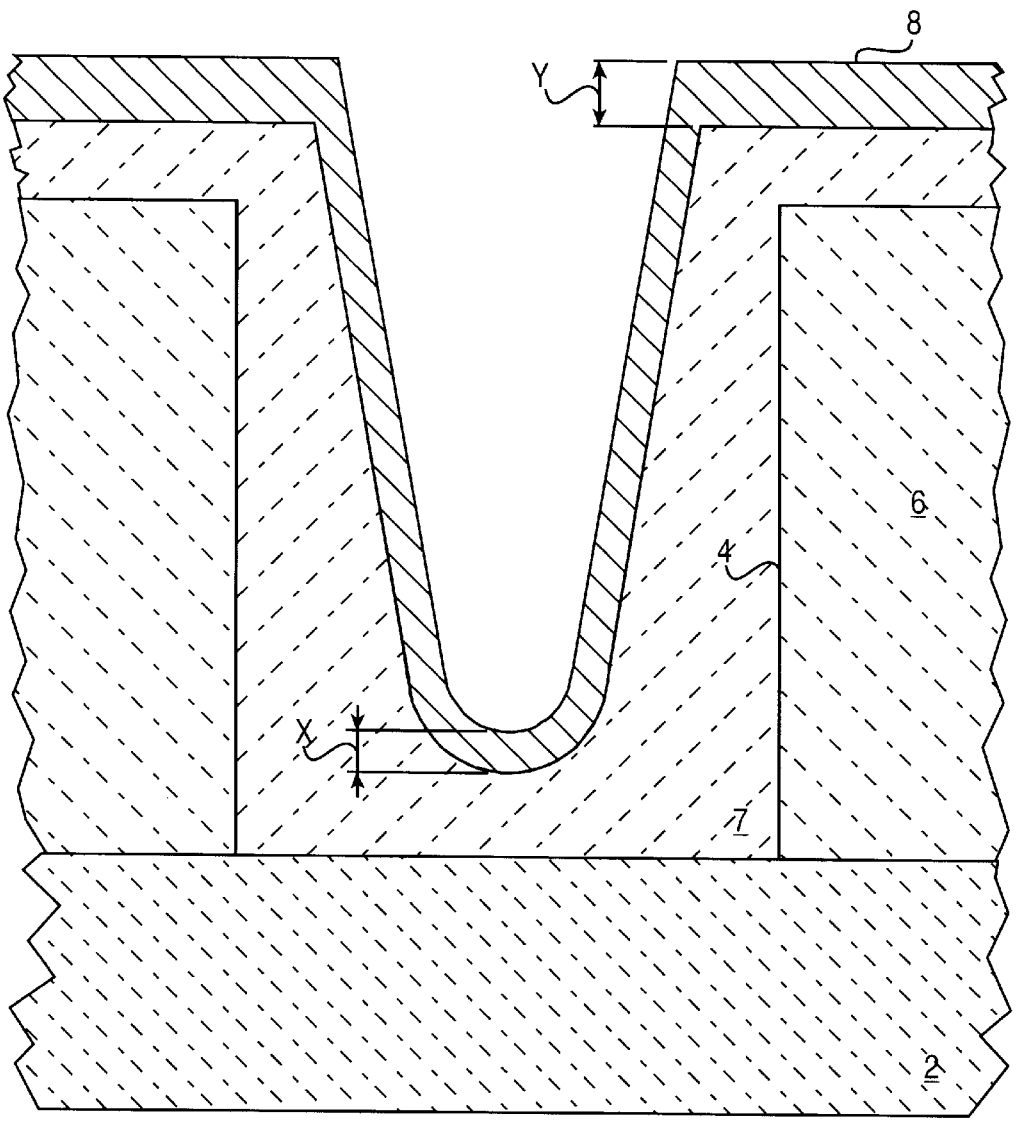
FIG. 1 is a fragmentary vertical cross-sectional view of an integrated circuit structure having a via or contact opening formed therein with a tungsten silicide layer over the integrated circuit structure, including this via, to compare the thickness of the tungsten silicide layer over the via compared to the remainder of the integrated circuit structure.
Figure 2:
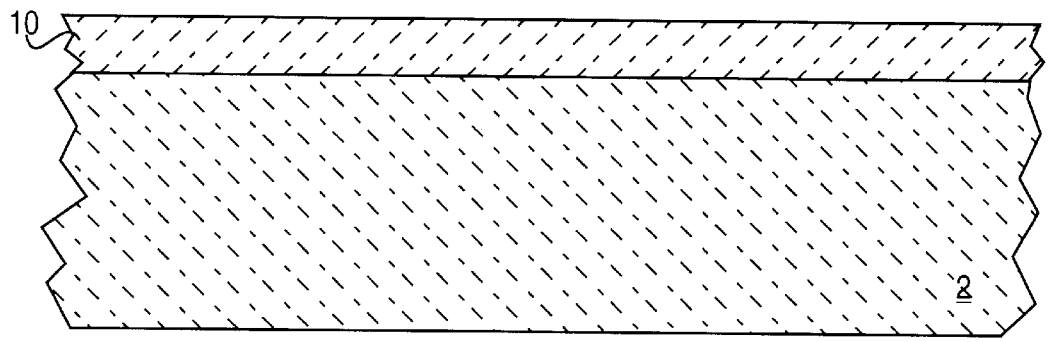
FIG. 2 is a fragmentary vertical cross-sectional view of an integrated circuit structure having a doped layer of polysilicon formed thereon.

Turning now to FIG. 2, an integrated circuit structure 2 is shown formed with a doped polysilicon layer 10 deposited thereon. Integrated circuit structure 2 comprises a semiconductor substrate on which any combination of active and/or passive devices have been already formed and over which polysilicon layer 10 will be formed to provide contacts and/or interconnects with the underlying integrated circuit structure and which is, therefore, doped to increase its conductivity. Doped polysilicon layer 10 may comprises a single homogeneous doped polysilicon layer or it may comprise a composite or sandwich of alternating doped and undoped layers such as described in Beinglass U.S. Pat. No. 5,141,892, assigned to the assignee of this application, and the disclosure of which is hereby incorporated by reference. When doped layer 10 does comprise such a composite, however, the uppermost layer or top surface of the composite must comprise a doped layer, since doped polysilicon layer 10, by definition, comprises the doped polysilicon layer over which an undoped polysilicon layer will be formed, as will be described below. Doped polysilicon layer 10 may be deposited over integrated circuit structure 10 by any known method of depositing polysilicon such as, for example, by chemical vapor deposition (CVD) method, using a dopant gas.

Figure 3:
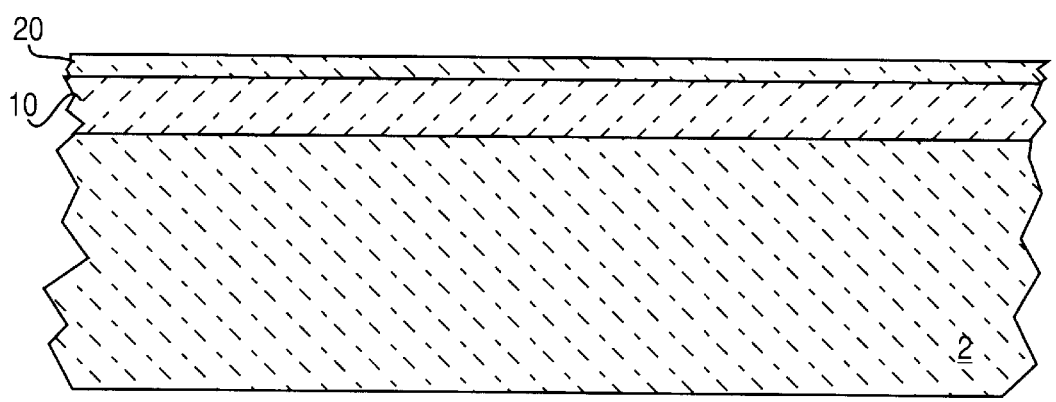
FIG. 3 is a fragmentary vertical cross-sectional view of the structure of FIG. 2 with an undoped capping layer of polysilicon formed over the doped polysilicon layer.

In accordance with the invention, as shown in FIG. 3, an undoped layer 20 of polysilicon is then deposited over doped silicon layer (or composite) 10. Undoped polysilicon layer 20 may, like doped polysilicon layer 10, be formed by any method such as by CVD formation.

Undoped polysilicon layer 20 should have a minimum thickness of at least about 100 Angstroms, and preferably at least about 300 Angstroms, to prevent dopant from the underlying doped polysilicon layer from migrating into and through undoped polysilicon layer 20 during its formation, The minimum thickness, however, will vary with the concentration of dopant in underlying doped polysilicon layer 10. For example, when underlying doped polysilicon layer 10 comprises an N+ doped layer having a dopant concentration of phosphorus of about $5 \times 10^{20}$ atoms/cm$^3$, the thickness of undoped polysilicon layer 20 should be at least about 300 Angstroms.

The maximum thickness of undoped polysilicon layer 20 is not as important a consideration, except that it should not exceed a thickness which would make it difficult to diffuse a sufficient amount of dopant into undoped polysilicon layer 20 from the underlying doped layer 10 during a subsequent anneal. However, since it is usually desirable to form such polysilicon lines as thin as possible, the maximum thickness of undoped polysilicon layer 20 would probably never exceed a thickness which would make such subsequent diffusion doping from underlying doped polysilicon layer 10 impossible. In any event, by maintaining the thickness of undoped polysilicon layer 20 under 1500 Angstroms, and preferably under 1000 Angstroms, such problems may be avoided.

Figure 4:
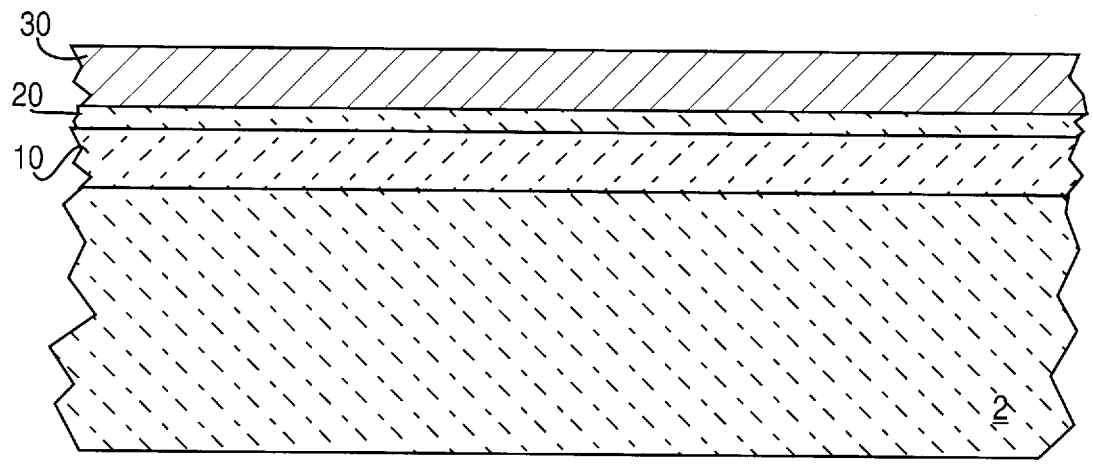
FIG. 4 is a fragmentary vertical cross-sectional view of the structure of FIG. 3 with the tungsten silicide layer formed over the undoped polysilicon layer.

After the formation of undoped polysilicon layer 20 over doped polysilicon layer 10, the coated integrated circuit structure 2 may be removed from the polysilicon deposition chamber or station, and moved to another deposition chamber or separate station in the same vacuum system, while maintaining polysilicon-coated structure 2 under vacuum, i.e., while not exposing the surface of polysilicon layer 20 to an oxidizing media. Referring now to FIG. 4, a layer 30 of tungsten silicide (WSi$_x$) is then deposited over undoped polysilicon layer 20 by flowing into the tungsten silicide vacuum deposition chamber a mixture of a tungsten-containing gas, such as WF$_6$, and dichlorosilane (DCS). Tungsten silicide layer 30 is formed using conventional tungsten silicide CVD processing conditions, except for the use of DCS, instead of the conventional silane source of silicon, to improve the step coverage of the resulting titanium silicide layer over the underlying polysilicon layers. For example, at a temperature of from about 500° C. to about 600° C. and a pressure ranging from about 500 milliTorr to about 2 torr, a gaseous mixture of about 100–200 standard cubic centimeters per minute (sccm) of DCS and about 5–15 sccm of WF$_6$, together with a carrier gas such as argon, may be flowed into a vacuum chamber having a volume, for example, of from about 3–12 liters to form the desired WSi$_x$ layer over the underlying undoped polysilicon layer 20.

Since underlying polysilicon layer 20 is not doped, the previously observed deposition of a tungsten-rich tungsten silicide (when the underlying polysilicon layer was doped) does not occur and instead a tungsten silicide is deposited wherein the stoichiometry of the tungsten and silicide, in the formula WSi$_x$ ranges from x=2.1 to x=2.9.

After formation of the desired non tungsten-rich tungsten silicide layer 30, undoped polysilicon layer is doped by diffusion of dopant from underlying doped polysilicon layer 10 during the next exposure of the structure to heat in excess of at least about 750° C. for a period in excess of about 30 minutes. This may occur, for example, during a subsequent heating of subsequently deposited planarizing glass, or may occur during annealing of underlying source/drain doped regions.

Figure 5:
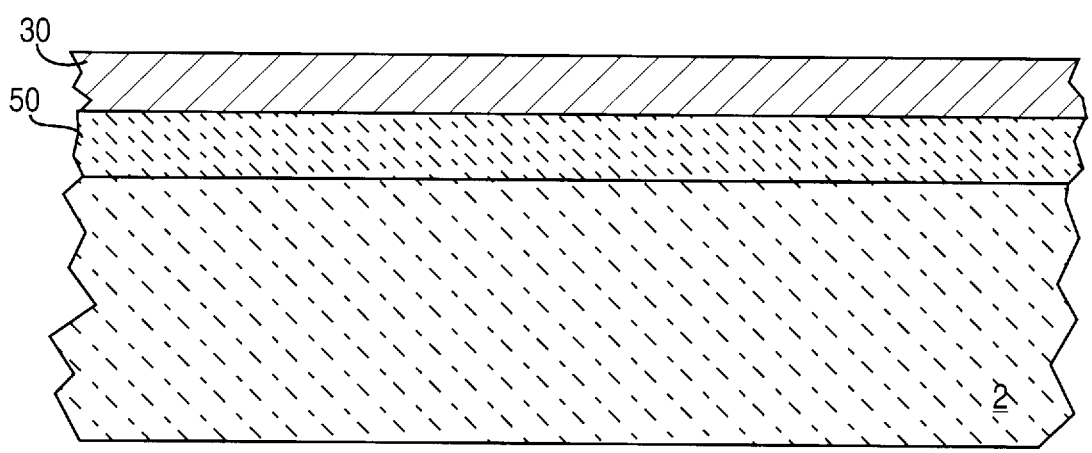
FIG. 5 is a fragmentary vertical cross-sectional view of the structure of FIG. 4 after the structure has been subjected to an annealing temperature to permit the dopant in the doped layer of polysilicon to diffuse into the undoped capping layer of polysilicon, causing the two layers to become the illustrated single homogeneous doped polysilicon layer.

In any event, after being subject to such an anneal and diffusion of dopant therein from underlying doped polysilicon layer 10, undoped polysilicon layer 20 becomes integrated with polysilicon layer 10 to form a single (homogeneous) doped polysilicon layer 50 beneath tungsten silicide layer 30, as shown in FIG. 5. Thus, the final structure shown in FIG. 5 has the same materials as when silane is used for formation of the tungsten silicide layer (i.e., a doped polysilicon layer with a $WSi_x$ layer formed thereon), but with less fluorine, and with the improved step coverage which is afforded by the use of DCS as the source of silicon, and without, however, the prior art formation of the tungsten-rich tungsten silicide layer which previously was characteristic of the use of DCS in the formation of tungsten silicide over doped polysilicon layers.

To further illustrate the invention, a 300 Angstrom layer of undoped polysilicon was CVD formed over a previously deposited phosphorus-doped polysilicon layer formed over integrated circuit structure formed on a silicon semiconductor wafer. Following formation of the undoped polysilicon layer the structure was removed from the polysilicon deposition chamber and transported under vacuum to a tungsten silicide deposition chamber. A 1500 Angstrom tungsten silicide layer was then deposited over the undoped polysilicon layer by flowing 3.5 sccm of $WF_6$ gas and 175 sccm of dichlorosilane into the vacuum chamber, while maintaining the chamber at a pressure of 1000 millitorr and the wafer at a temperature of about 550° C. After a period of about 3.5 minutes, the flow of gases was shut off, and the coated wafer was removed from the chamber. As a control, a second wafer, also containing a doped polysilicon layer, but without the undoped polysilicon capping layer formed thereover, was also subjected to the identical tungsten silicide deposit, i.e., using DCS as the source of silicon in both instances.

Figure 6:
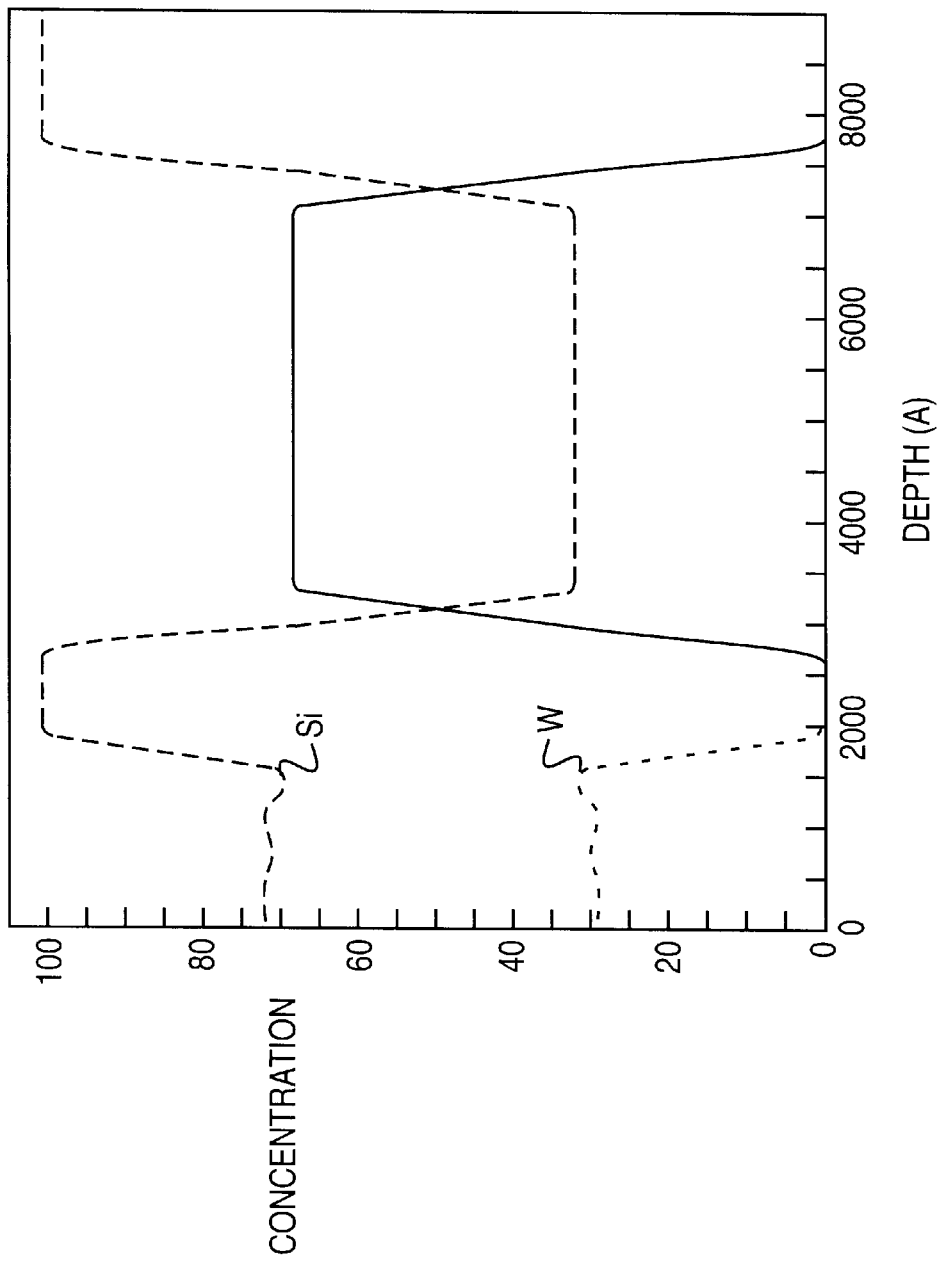
FIG. 6 is an RBS plot showing the respective concentrations of both tungsten and silicide versus depth in the tungsten silicide layer formed in accordance with the invention.
Figure 7:
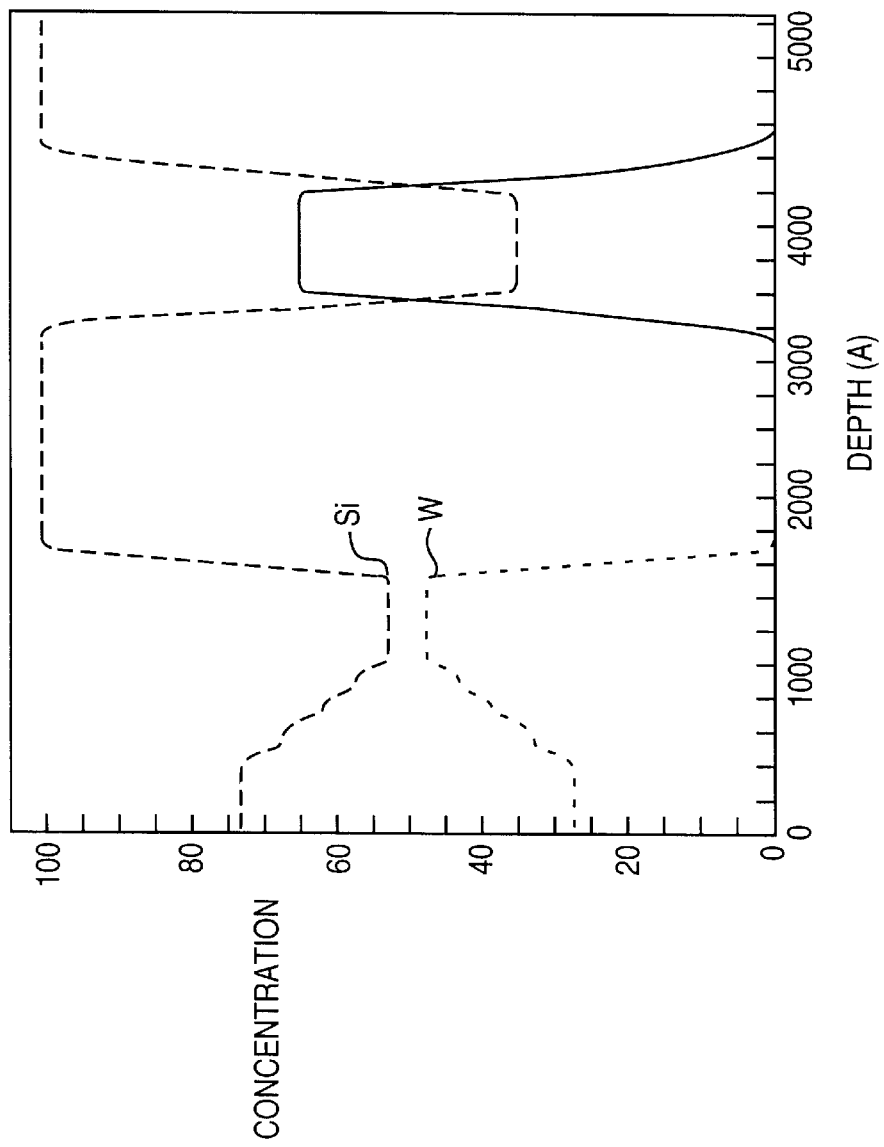
FIG. 7 is an RBS plot showing the respective concentrations of both tungsten and silicide versus depth in the tungsten silicide layer formed over a doped polysilicon layer in accordance with the prior art.
Figure 8:
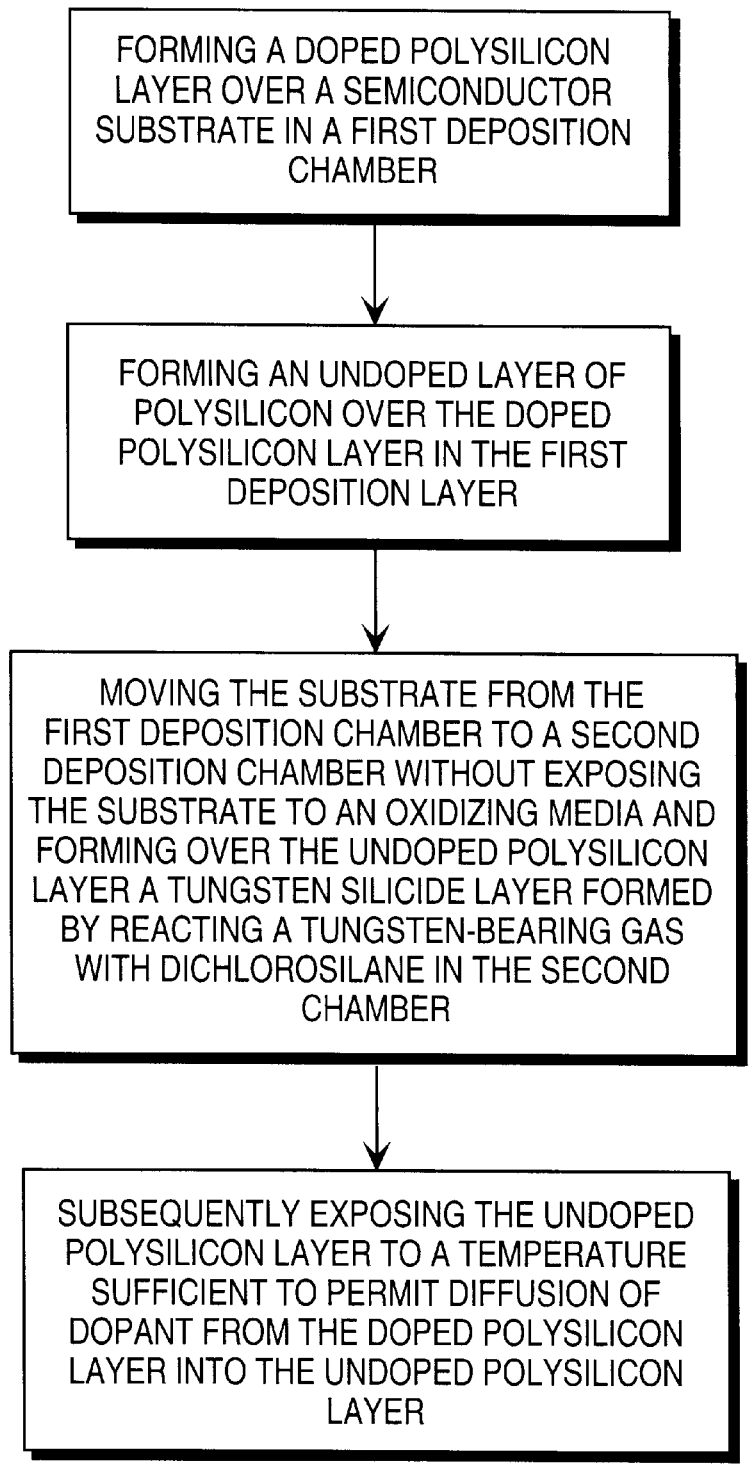
FIG. 8 is a flowsheet illustrating the process of the invention.

The deposited tungsten silicide layers on the respective wafers were then examined by Rutherford Backscattering (RBS) to determine the ratio of tungsten versus silicon in the tungsten silicide layers. The wafer having the tungsten silicide layer formed over the undoped capping layer of polysilicon, in accordance with the invention, was found to have a ratio of tungsten to silicon of about 1:2.3 at the tungsten silicide/polysilicon interface, as shown in Table I below and in the graph of FIG. 6. In contrast, the control wafer having the tungsten silicide layer deposited directed over the doped polysilicon layer was found to have a tungsten to silicon ratio of 1:1.1, as shown in Table II and in the graph of FIG. 7.

TABLE I

Ratio of Tungsten to Silicon in Tungsten Silicide

| Depth (Angstroms) | Atomic Concentration (%) | Si/W | |
|---|---|---|---|
| | | Si | W | Ratio |
| <250 | | 71.6 | 28.4 | 2.52 |
| 500–1050 | | 70.6 | 29.4 | 2.40 |
| 1050–1350 | | 72.1 | 27.9 | 2.58 |
| 1350–1505 | | 69.4 | 30.6 | 2.26 |
| W/Si Interface | | | | |
| 1505–2755 | | 100 | — | — |

TABLE II

Ratio of Tungsten to Silicon in Tungsten Silicide (Control)

| Depth (Angstroms) | Atomic Concentration (%) | Si/W | |
|---|---|---|---|
| | | Si | W | Ratio |
| <490 | | 71.5 | 28.5 | 2.51 |
| 490–680 | | 61.7 | 38.3 | 1.61 |
| 680–870 | | 57.5 | 42.5 | 1.35 |
| 870–1720 | | 52.5 | 47.5 | 1.11 |
| W/Si Interface | | | | |
| 1720–3220 | | 100 | — | — |

In both instances the step coverage was comparable, i.e., comprised the improved step coverage characteristic of a DCS-formed tungsten silicide. The fluorine content of both tungsten silicide films, as measured by Secondary Ion Mass Spectroscopy (SIMS), is low, i.e., comprises the reduced fluorine content characteristic of a DCS-formed tungsten silicide film.

Thus, the invention provides an improved polysilicon/tungsten silicide ($WSi_x$) composite layer formed over an integrated circuit structure on a semiconductor wafer and characterized by improved step coverage and a non tungsten-rich tungsten: silicon ratio in the $WSi_x$ layer, and method of forming same, wherein a tungsten silicide layer on an underlying doped polysilicon layer possesses the tungsten:silicon ratio of a tungsten silicide layer formed using silane as the source of silicon, while also exhibiting the low fluorine content good step coverage over the underlying polysilicon layer characteristic of a tungsten silicide layer formed using dichlorosilane as the source of silicon.

Having thus described the invention what is claimed is:

1. A method of making an integrated circuit structure on a semiconductor substrate comprising a tungsten silicide layer formed over a polysilicon layer which comprises:

a) forming in a first deposition chamber a polysilicon film having a doped surface portion thereon;

b) forming in said first deposition chamber an undoped second layer of polysilicon directly over said doped surface of said first polysilicon layer; and c) moving said semiconductor substrate into a second deposition chamber without exposing the surface of said undoped polysilicon layer to an oxidizing media, and forming in said second deposition chamber a layer of tungsten silicide directly over said undoped second polysilicon layer by reaction of a tungsten-bearing gas with dichlorosilane.

2. The method of claim 1 wherein said step of forming said undoped second polysilicon layer further comprises forming a layer of said undoped polysilicon of sufficient thickness to prevent dopant from said underlying doped surface of said first polysilicon layer from diffusing through said undoped second polysilicon layer to interfere with said step of forming said tungsten silicide over said undoped second polysilicon layer.

3. The method of claim 1 wherein said step of forming said undoped second polysilicon layer further comprises forming at least about 100 Angstroms of said undoped polysilicon over said doped surface of said first polysilicon layer.

4. The method of claim 3 wherein said step of forming said undoped second polysilicon layer further comprises forming at least about 300 Angstroms of said undoped polysilicon over said doped surface of said first polysilicon layer.

5. The method of claim 3 wherein said step of forming said undoped second polysilicon layer further comprises forming not more than about 1500 Angstroms of said undoped polysilicon over said doped surface of said first polysilicon layer.

6. The method of claim 5 wherein said step of forming said undoped second polysilicon layer further comprises forming not more than about 1000 Angstroms of said undoped polysilicon over said doped surface of said first polysilicon layer.

7. The method of claim 1 wherein said step of forming said undoped second polysilicon layer further comprises forming a thickness of said undoped second layer insufficient to prevent subsequent doping of said undoped second polysilicon layer by diffusion from said underlying doped surface of said first polysilicon layer, when exposed to an elevated temperature of at least about 750° C. for at least about 30 minutes.

8. The method of claim 1 wherein said step of forming said tungsten silicide layer further comprises forming a tungsten silicide layer having a tungsten to silicon ratio which is uniform throughout the tungsten silicide layer.

9. The method of claim 1 wherein said step of forming said tungsten silicide layer further comprises forming a tungsten silicide layer having a tungsten to silicon ratio of from about 1:2.1 to about 1:2.9.

10. The method of claim 1 including the additional step of subsequently subjecting said structure to a temperature sufficient to cause dopant in said doped surface of said first polysilicon layer to diffuse into said undoped polysilicon layer.

11. A method of making an integrated circuit structure on a semiconductor substrate comprising a tungsten silicide layer characterized by a tungsten to silicon ratio which is uniform throughout the tungsten silicide layer and improved step coverage over underlying uneven topographies which comprises:

a) forming in a first deposition chamber a polysilicon film having a doped surface portion thereon;

b) forming in said first deposition chamber an undoped second layer of polysilicon directly over said doped surface of said first polysilicon layer;

c) moving said semiconductor substrate into a second deposition chamber without exposing the surface of said undoped polysilicon layer to an oxidizing media, and forming in said second deposition chamber a layer of tungsten silicide directly over said undoped second polysilicon layer by reaction of a tungsten-bearing gas with dichlorosilane; and d) subsequently subjecting said structure to a temperature sufficient to cause dopant in said doped surface of said first polysilicon layer to diffuse into said undoped second polysilicon layer.

12. A method of making an integrated circuit structure on a semiconductor substrate comprising a tungsten silicide layer characterized by a tungsten to silicon ratio of about 1:2.1 to about 1:2.9 and improved step coverage over underlying uneven topographies which comprises:

a) forming in a first deposition chamber a polysilicon film having a doped surface portion thereon;

b) forming in said first deposition chamber an undoped second layer of polysilicon directly over said doped surface of aid first polysilicon layer;

c) moving said semiconductor substrate into a second deposition chamber without exposing the surface of said undoped polysilicon layer to an oxidizing media, and forming in said second deposition chamber a layer of tungsten silicide directly over said undoped second polysilicon layer by reaction of a tungsten-bearing gas with dichlorosilane; and d) subsequently subjecting said structure to a temperature sufficient to cause dopant in said doped surface of said first polysilicon layer to diffuse into said undoped second polysilicon layer.

13. The method of claim 12 wherein said step of forming said undoped second polysilicon layer further comprises forming over said doped surface of said first polysilicon layer an undoped layer of polysilicon having:

a) a minimum thickness of at least about 100 Angstroms and sufficient to prevent dopant from said underlying doped surface of said first polysilicon layer from diffusing through said undoped second polysilicon layer to interfere with said step of forming said titanium silicide over said undoped second polysilicon layer; and b) a maximum thickness not exceeding about 1500 Angstroms and insufficient to prevent subsequent doping of said undoped second polysilicon layer by diffusion from said underlying doped surface of said first polysilicon layer.

14. A method of making an integrated circuit structure on a semiconductor substrate comprising a tungsten silicide layer formed over a silicon layer which comprises:

a) forming in a first deposition chamber a silicon film having a doped surface portion thereon;

b) forming in said first deposition chamber an undoped second layer of silicon directly over said doped surface of said first silicon layer; and c) moving said semiconductor substrate into a second deposition chamber without exposing the surface of said undoped silicon layer to an oxidizing media, and forming in said second deposition chamber a layer of tungsten silicide directly over said undoped second silicon layer by reaction of a tungsten-bearing gas with dichlorosilane.

* * * * *